US 6,689,255 B2

(12) United States Patent
Baldwin et al.

(10) Patent No.: US 6,689,255 B2
(45) Date of Patent: *Feb. 10, 2004

(54) SYSTEM AND METHOD FOR MAKING THIN-FILM STRUCTURES USING A STEPPED PROFILE MASK

(75) Inventors: David Alan Baldwin, Annadale, VA (US); Todd Lanier Hylton, Great Falls, VA (US)

(73) Assignee: 4 Wave, Inc., Sterling, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/166,532

(22) Filed: Jun. 10, 2002

(65) Prior Publication Data

US 2002/0155221 A1 Oct. 24, 2002

Related U.S. Application Data

(63) Continuation-in-part of application No. 09/810,969, filed on Mar. 16, 2001, now Pat. No. 6,419,803.

(51) Int. Cl.[7] .............................................. C23C 14/34
(52) U.S. Cl. ...................... 204/192.12; 204/192.13; 204/298.03; 204/298.11; 204/298.28; 118/720; 118/721; 118/688; 427/9; 427/282
(58) Field of Search ..................... 204/192.13, 298.03, 204/298.11, 192.12, 298.28; 118/720, 721, 688; 427/9, 282

(56) References Cited

U.S. PATENT DOCUMENTS

| | | | |
|---|---|---|---|
| 4,322,277 A | | 3/1982 | Opresko |
| 4,988,424 A | | 1/1991 | Woodward et al. |
| 5,320,728 A | | 6/1994 | Tepman |
| 5,580,428 A | | 12/1996 | Krivokapic et al. |
| 6,187,211 B1 | | 2/2001 | Smith |
| 6,338,775 B1 | * | 1/2002 | Chen ..................... 204/192.11 |
| 6,402,905 B1 | * | 6/2002 | Baldwin et al. ........ 204/192.13 |
| 6,419,803 B1 | * | 7/2002 | Baldwin et al. ........ 204/192.13 |

* cited by examiner

*Primary Examiner*—Rodney G. McDonald
(74) *Attorney, Agent, or Firm*—Morgan, Lewis & Bockius LLP

(57) ABSTRACT

A system and method for manufacturing thin-film structures disposed on a substrate. The thin-film structures have different respective thicknesses that vary along a radius of the substrate. A substrate rotates about an axis of rotation and a source of deposited material is directed at the rotating substrate. A mask having a stepped profile is positioned between the rotating substrate and the source. The stepped mask selectively blocks material emanating from the source from reaching the substrate. Each step of the profile of the mask corresponds to one of the respective thicknesses of the thin-film structures. The radius along which the different respective thicknesses of the film-thin structures vary is measured from the axis of rotation of the rotating substrate, and the substrate includes at least one wafer having a center that is either coincident or offset from the axis of rotation.

19 Claims, 14 Drawing Sheets

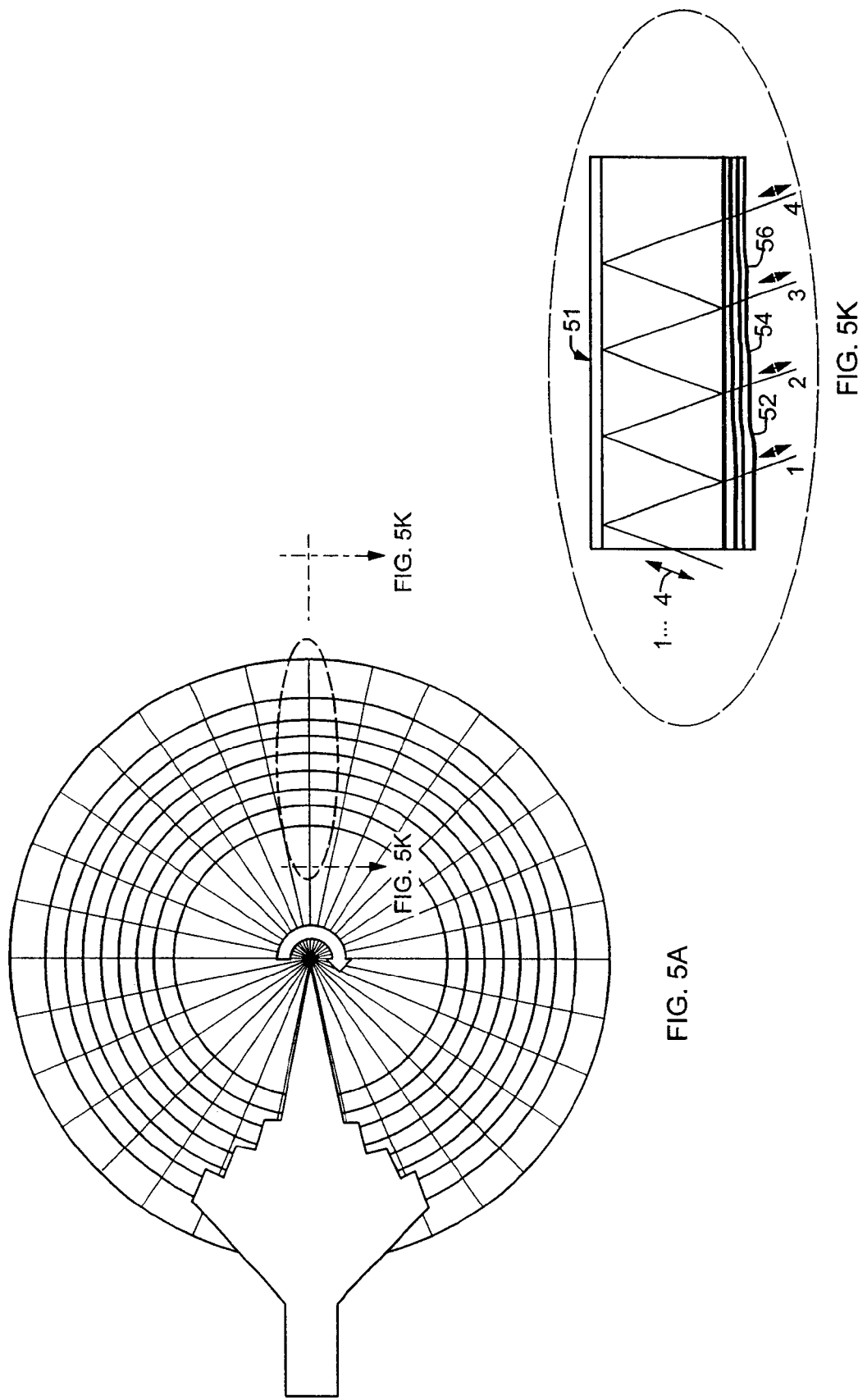

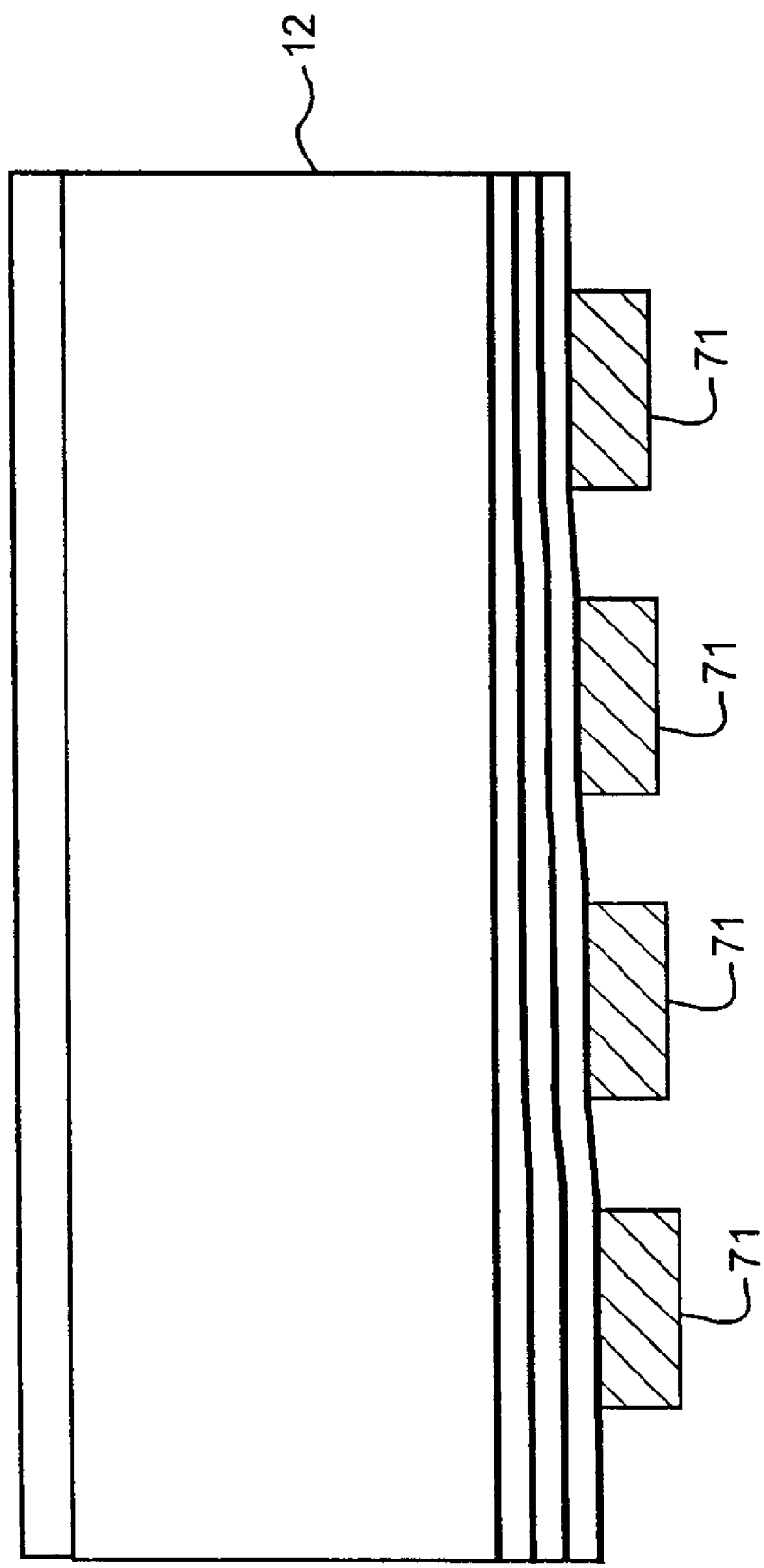

SYSTEM AND METHOD FOR MAKING THIN-FILM STRUCTURES USING A STEPPED PROFILE MASK

CROSS-REFERENCE TO RELATED APPLICATION

The present application is a continuation-in-part of U.S. patent application Ser. No. 09/810,969, filed Mar. 16, 2001, entitled "System and Method for Making Thin-Film Structures Using a Stepped Profile Mask." now U.S. Pat. No. 6,419,803.

FIELD OF INVENTION

The present invention is directed generally to novel systems and methods for performing thin film deposition, and to optical devices manufactured using such systems and methods.

BACKGROUND OF THE INVENTION

It is believed that in vapor deposition systems such as ion beam sputtering, magnetron sputtering, diode sputtering, thermal evaporation, electron beam evaporation, pulse laser vaporization and cathodic arc vaporization, atoms or molecules ejected from a target material are directed toward a substrate where they condense to form a thin layer of material on the substrate. In the case of an optical filter, this allows a user to create a device on a substrate with a single optical frequency characteristic. It would be beneficial to provide a system that enables a user to simultaneously deposit multiple thin-film structures on a substrate, each structure having a different respective thickness, in order to simultaneously create a series of optical filters with multiple optical frequency characteristics on the substrate.

SUMMARY OF THE INVENTION

The present invention is directed to a system and method for manufacturing thin-film structures disposed on a substrate. The thin-film structures have different respective thicknesses that vary along a radius of the substrate. A substrate rotates about an axis of rotation and a source of deposited material is directed at the substrate. A mask having a stepped profile is positioned between the rotating substrate and the source. The stepped mask selectively blocks material emanating from the source from reaching the substrate. Each step of the profile of the mask corresponds to one of the respective thicknesses of the thin-film structures. The radius, along which the different respective thicknesses of the thin-film structures vary, is measured from the axis of rotation of the substrate, and the substrate includes at least one wafer having a center that is either coincident or offset from the axis of rotation.

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention. In the Drawings:

FIGS. 5A–5K illustrate several methods for manufacturing various embodiments of optical filters and multiplexers, in accordance with the present invention.

DETAILED DESCRIPTION OF THE PREFERRED EMBODIMENTS

Figure 1:
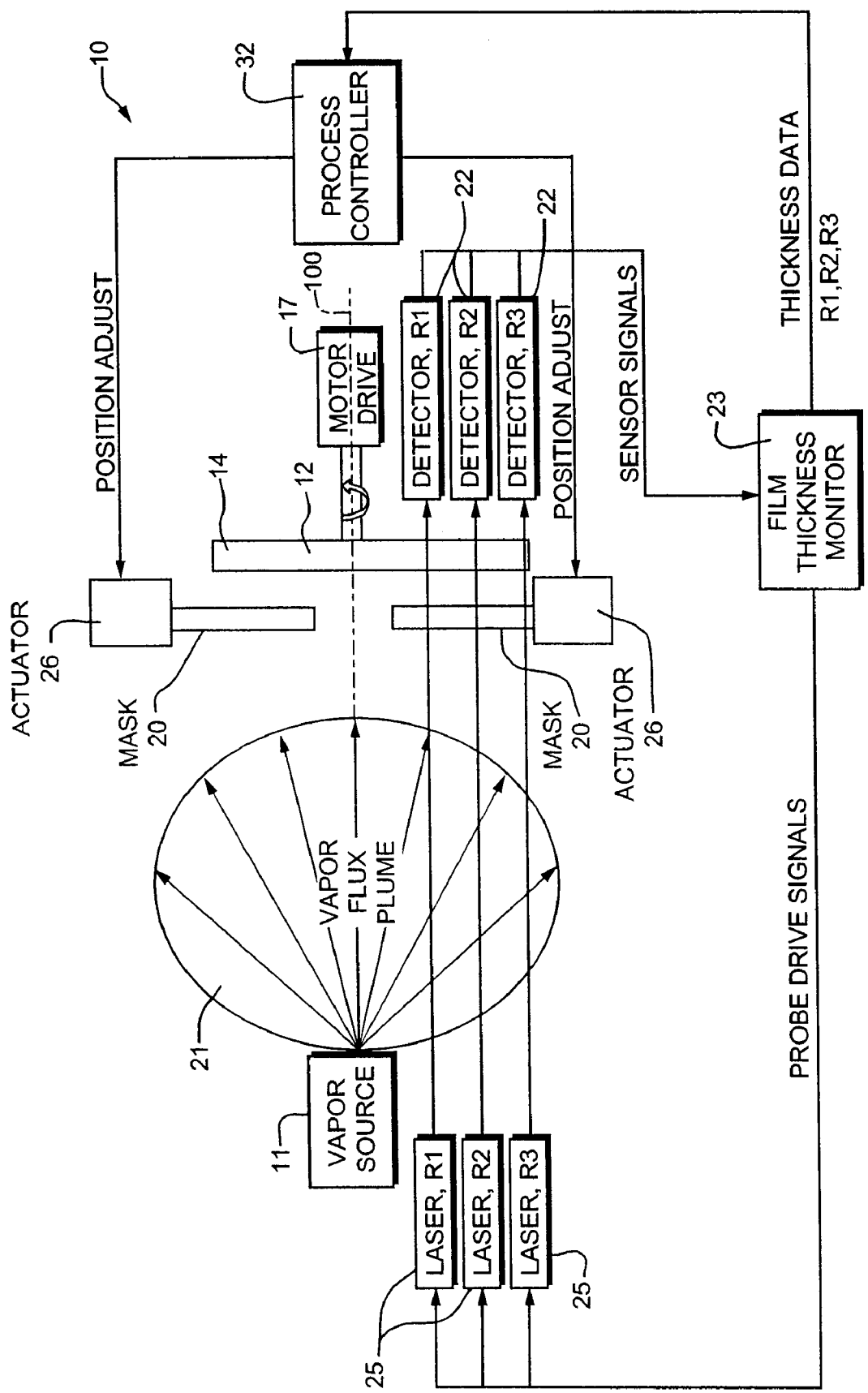
FIG. 1 is a diagram of a system for making thin-film structures using a stepped profile mask according to the present invention.

There is shown in FIG. 1, a system 10 for manufacturing thin-film structures that are disposed on a substrate 12 that includes at least one wafer 14. In one embodiment shown in FIG. 2, the thin-film structures 16a, 16b, 16c, 16d are initially formed in the shape of bands on substrate 12. Each of the thin-film structures 16a, 16b, 16c, 16d is formed by depositing material (from a vapor source 11) on substrate 12. In one embodiment, each of the thin-film structures (or bands) 16a, 16b, 16c, 16d is formed from a different thickness of deposited material (or deposition thickness) on substrate 12. Although the present invention is described as having four thin-film structures on substrate 12, it will be understood by those skilled in the act art that the teachings of the present invention can be applied to produce other numbers of thin-film structures (each having a different deposition thickness) simultaneously on substrate 12 by simply varying the number of steps in mask 20 as described below.

Referring now to FIGS. 1–4, the deposition thicknesses of the layers of each thin-film structure (or band) 16a, 16b, 16c, 16d vary along a radius 13 of the substrate 12. For example, the deposition thickness of each layer in band 16a is different from the deposition thickness of each layer in band 16b, which is different from the deposition thickness of each layer in band 16c, which is different from the deposition thickness of each layer in band 16d. Thus, although the deposition thickness of each layer within each band is generally uniform, the deposition thickness of each layer varies from band to band. In the embodiment shown in FIGS. 2–3, the deposition thickness of each layer of each successive band decreases as the diameter of the bands expand. However, it will be understood by those skilled in the art that the deposition thickness of each layer of each successive band could be made to increase as the diameter of the bands increases, simply by altering the shape of mask 20.

System 10 includes a motor 17 that rotates the substrate 12 about an axis 100 of rotation. In the embodiment shown, axis 100 is generally normal to the deposition surface of substrate 12. System 10 also includes a vapor source 11 of deposited material 15 that is directed at the rotating substrate 12. Vapor source 11 creates a vapor flux plume 21 that is disposed proximate the 5 substrate 12. Material 15 from the vapor flux plume 21 is deposited on the rotating substrate 12. Vapor source 11 may be, for example, a negatively biased target that is sputtered by energetic ions that cause ejection of material from the target. Other vapor sources are well known in the art and can be used for implementing the present invention. In one embodiment, vapor source 11 includes a target that is acted upon by a divergent beam ion source such as a Hall-current ion source. In this embodiment, the ion source generates an ion beam that is generally directed about a central axis and projects an ion current having a magnitude that varies throughout the beam in accordance with the equation: ion current=$J_o \cos(\theta)$; where $\theta$ is an angle between the central axis and a direction of the ion current within the beam, and $J_o$ is the current density along the central axis. A further preferred embodiment includes both said divergent beam ion source and additionally a negative target bias, with either DC, various types of pulsed-DC or RF waveforms.

Figure 2:
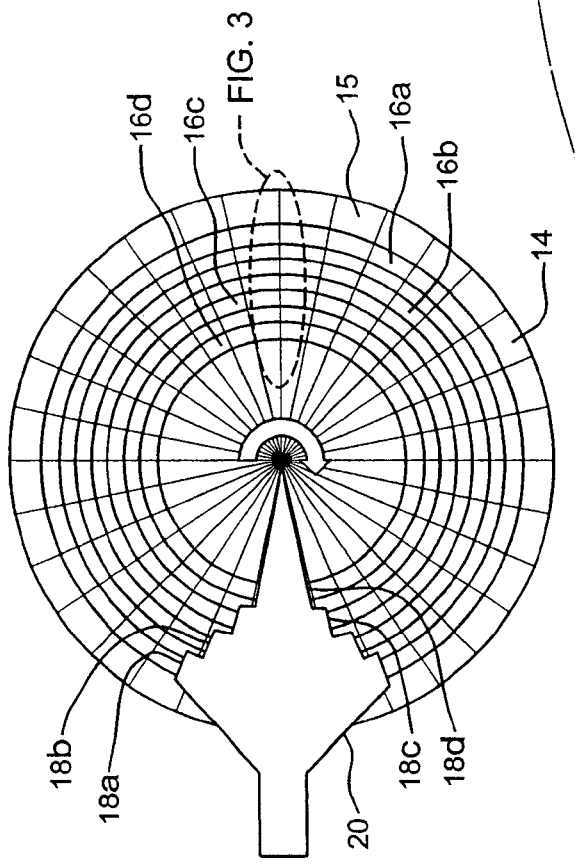
FIG. 2 is a diagram showing use of the stepped profile mask to create bands of deposited material having different thicknesses on a substrate that includes a single wafer.

The system 10 further includes a mask 20 that has a stepped profile. As shown in FIG. 2, each step 18a, 18b, 18c, 18d of the profile corresponds to one of the respective bands 16a, 16b, 16c or 16d formed on substrate 12. As mentioned above, it should be recognized by those skilled in the art that the number of steps 18 on the mask 20 and the number and thicknesses of the various bands on the substrate 12 are not limited to the embodiment shown. Mask 20 is positioned between the rotating substrate 12 and the vapor source 11. A shadow 33 of the mask 20 acts to selectively block material in vapor plume 21 from reaching and being deposited on substrate 12. The amount of material blocked by mask 20 depends on the size of the shadow 33 of mask 20 cast on substrate 12 at any given position along radius 13. In one embodiment, the stepped mask 20 is fixed relative to the rotating substrate 12 and does not move or pivot during film deposition.

The system 10 also includes at least one actuator 26 that varies a shadow 28 of a second mask 30 that is disposed over the rotating substrate 12. The radius 13 is measured from the axis 100 of rotation of the rotating substrate 12. System 10 also includes at least one optical detector 22 that monitors the different respective thicknesses of the bands 16a, 16b, 16c, 16d that are disposed along the radius 13 of the substrate 12. Optical detectors 22 monitor the thicknesses by probing the different thicknesses of bands 16a, 16b, 16c, 16d with light. A process controller 32 is coupled to the optical detector 22 and the actuator 26. In response to deposition thickness data supplied from the detectors 22, the process controller 32 may vary the shadow 28 of the mask 30 along a radius 13 of the substrate 12 to control the thicknesses of the bands 16a, 16b, 16c, 16d as they are being formed on substrate 12, or it may terminate the deposition when a desired thickness is reached.

Figure 4:
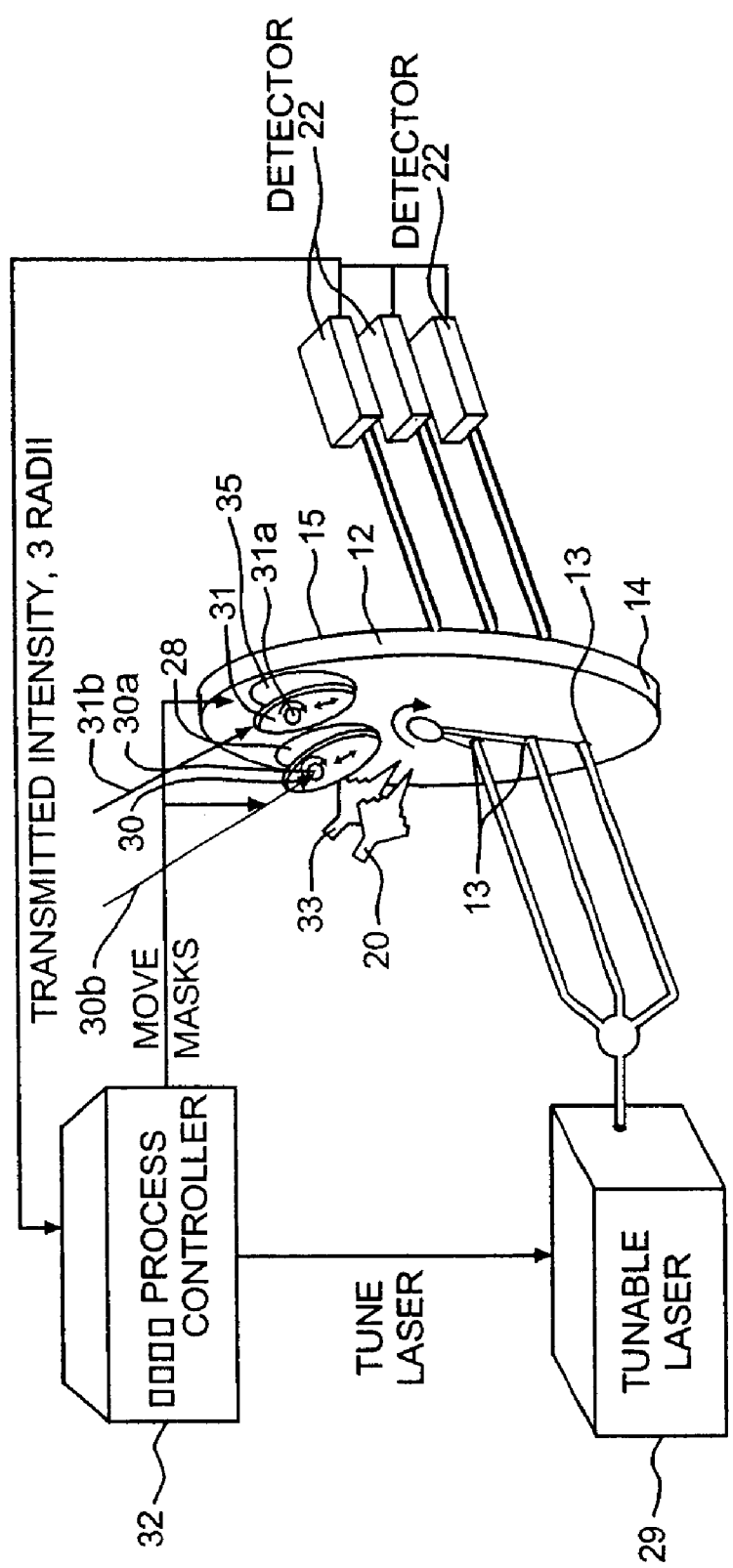
FIG. 4 is a further diagram showing various components of the system of FIG. 1.

As shown in FIG. 4, system 10 also includes a shadow 35 of a third mask 31 that is disposed over the rotating substrate 12. The process controller 32 optionally varies the shadow 35 of the mask 31 along a radius 13 of the substrate 12 to compensate for unwanted variations in deposition thickness within a particular band 16a, 16b, 16c, 16d.

In one embodiment, each actuator 26 varies a corresponding shadow 35, 28 by pivoting a corresponding mask 31, 30 about a pivot point 31a, 30a. In a further embodiment, each actuator 26 varies a corresponding shadow 35, 28, respectively, by "tilting" or rotating the respective mask 31, 30 about the central axes 31b, 30b of the corresponding masks 31 and 30. It will be understood by those skilled in the art that each shadow 35, 28 could be varied using a combination of the methods described above, or by moving masks 31 and 30 in other ways such as along (or parallel to) a radius of the substrate 12.

Although in the embodiment shown, substrate 12 is circular in shape, it will be understood that a substrate 12 that is square or some other shape could also be used with the present invention. In such a case, radius 13 would simply correspond to a line in the plane of the surface of substrate 12 and perpendicular to axis 100.

In the embodiment of FIG. 1, a film thickness monitor 23 is coupled to the optical detectors 22 and one or more lasers 25, each of which corresponds to one of the optical detectors 22. In another embodiment as shown in FIG. 2, laser 25 may be a tunable laser 29. It should be recognized by those skilled in the art that the functions of process controller 32 and the film thickness monitor 23 may be combined into a single controller. In addition, a variety of light sources (e.g., light emitting diodes (LED's), gas sources, or broadband filtered lights, etc.) may be used in place of lasers 25.

A method for manufacturing thin-film structures disposed on a substrate 12 using the system 10 as shown in FIGS. 1–4 will now be described. The method comprises the steps of rotating a substrate 12 and directing a source 11 of deposited material 15 at the rotating substrate 12. An optical detector 22 monitors the different respective thicknesses of the bands being formed along the radius 13 of the wafer 14 by probing the different bands with light. The shadows 35 and 28 of masks 31 and 30 disposed over the rotating substrate 12 are varied with actuators 26. Optical detector 22 and actuators 26 are coupled to the process controller 32. In response to deposition thickness data from at least one optical detector 22, the process controller varies the shadows 35 and 28 of the masks 31 and 30 along the radius 13 of the substrate 12 to control and compensate for unwanted variations in deposition thickness. The process controller also terminates the deposition when the desired thickness is reached.

Figure 3:
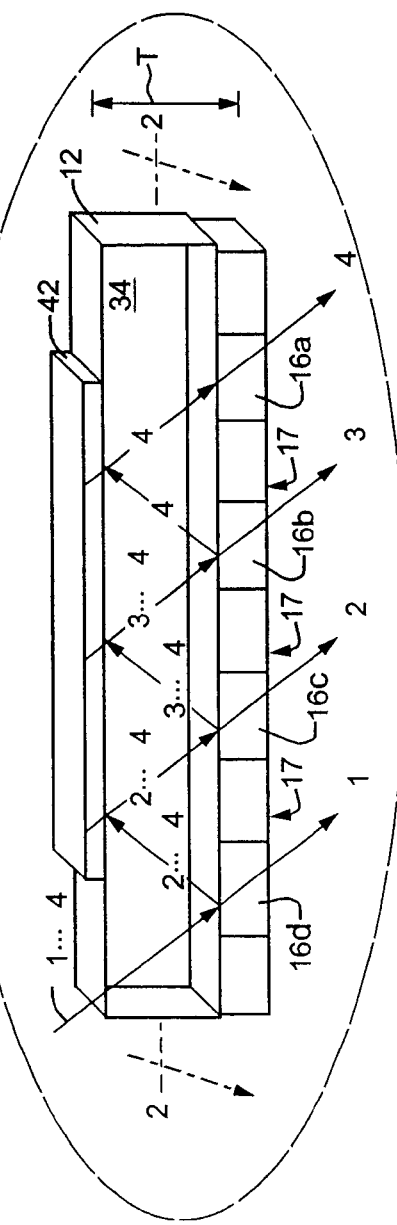
FIG. 3 is a cross-section of an optical filter created from a section of the wafer shown in FIG. 2.

The system and process described above may be advantageously used to create an optical filter 34. When the present invention is used to form an optical filter 34, the substrate 12 is preferably formed of a glass wafer, the material deposited on the substrate is comprised of alternating layers of tantalum oxide and silicon oxide, and the thicknesses of the material deposited on the substrate at each band 16a, 16b, 16c, 16d, respectively, are low order multiples of quarter wavelength optical thicknesses at the wavelengths of light that the filter will serve to isolate. After the wafer 14 is formed as shown in FIG. 2, the wafer 14 is then sliced into segments such as that shown in FIG. 3 in order to form each optical filter. As shown in FIG. 3, an optical filter capable of isolating multiple wavelengths of light may be formed by affixing or depositing a mirror on the side of substrate 12 opposite thin-film structures 16a, 16b, 16c, 16d. The mirror may be affixed or deposited either before or after slicing wafer 14 into segments. In one embodiment, the spacing between the center of adjacent optical structures 16 is described by the equation:

$$2(T)/\tan\theta;$$

where T=the transport region thickness, and $\theta$=incident angle of light with respect to a plane of the substrate. FIG. 3 illustrates the operation of an optical demultiplexer. A plurality of wavelengths input into the device are separated by wavelength at different positions along the length of the device. The thin film structures 16a, 16b, 16c, 16d are filters tuned to different wavelengths. It will be recognized by those skilled in the art that an optical multiplexer may be formed by reversing the direction of the optical signals applied to the optical filters described herein. The optical multiplexer combines a plurality of different input optical signals to form a combined signal at an output aperture.

FIGS. 5A–5K illustrate several methods for manufacturing various embodiments of optical filters and multiplexers, in accordance with the present invention. Optical filter 51 (shown in FIGS. 5A, 5K) is substantially the same as optical filter 34 (FIG. 3), except that the generalized inter-channel transition structures 17 in filter 34 are shown for a particular embodiment in filter 51. In optical filter 51, the inter-channel transition regions 52, 54, 56, are formed of the same material used to form the optical structures themselves, with the thicknesses of the various layers in the optical structures transitioning gradually between each pair of adjacent optical structures. Optical filter 51 may be formed using the system of FIG. 1. Without use of the masks described in connection with FIGS. 5B–5J, the gradually transitioning between each adjacent pair of optical structures will occur without further intervention as a consequence of use of stepped profile mask 20 as described above.

Figure 5B:
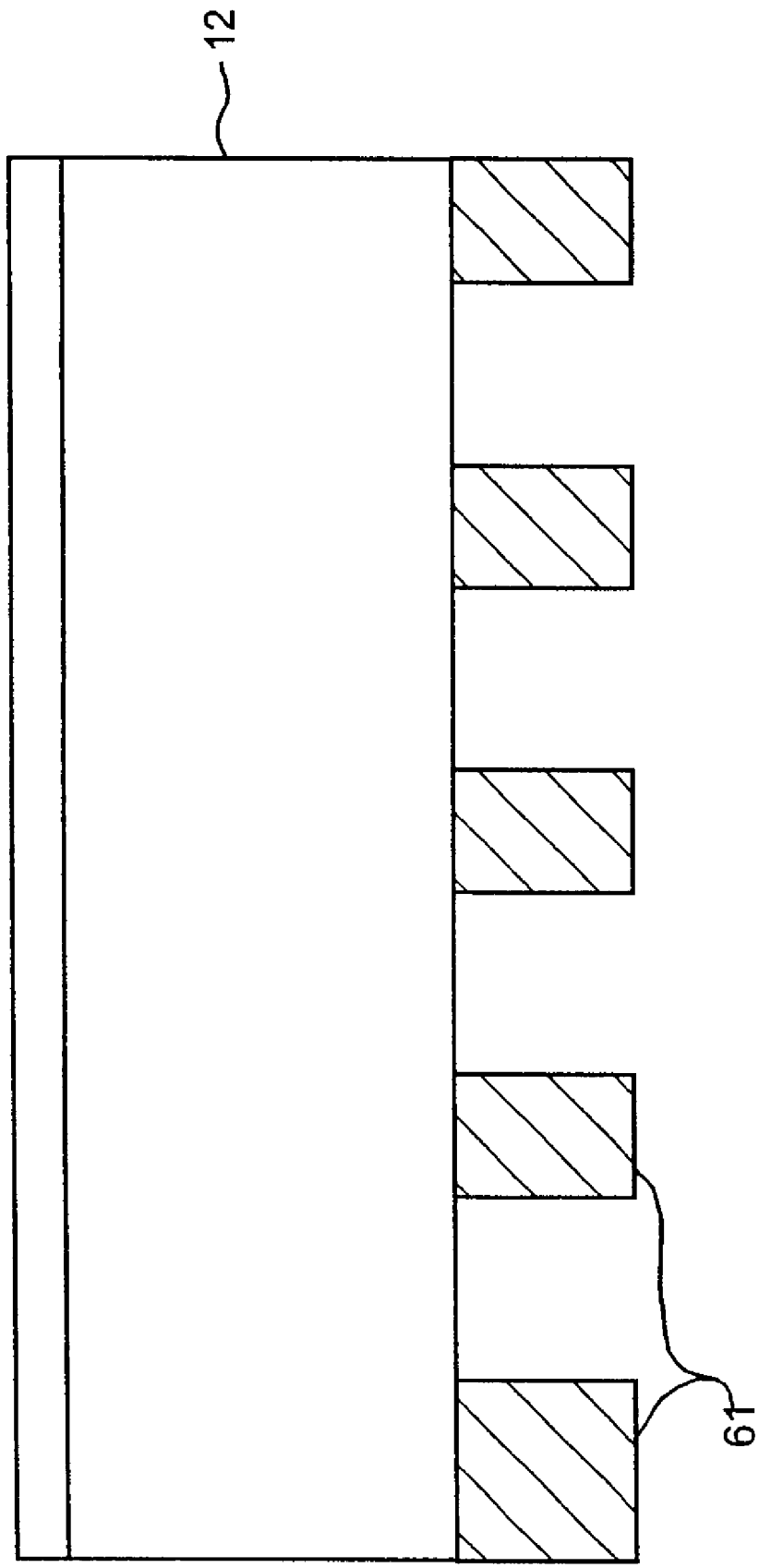
Figure 5C:
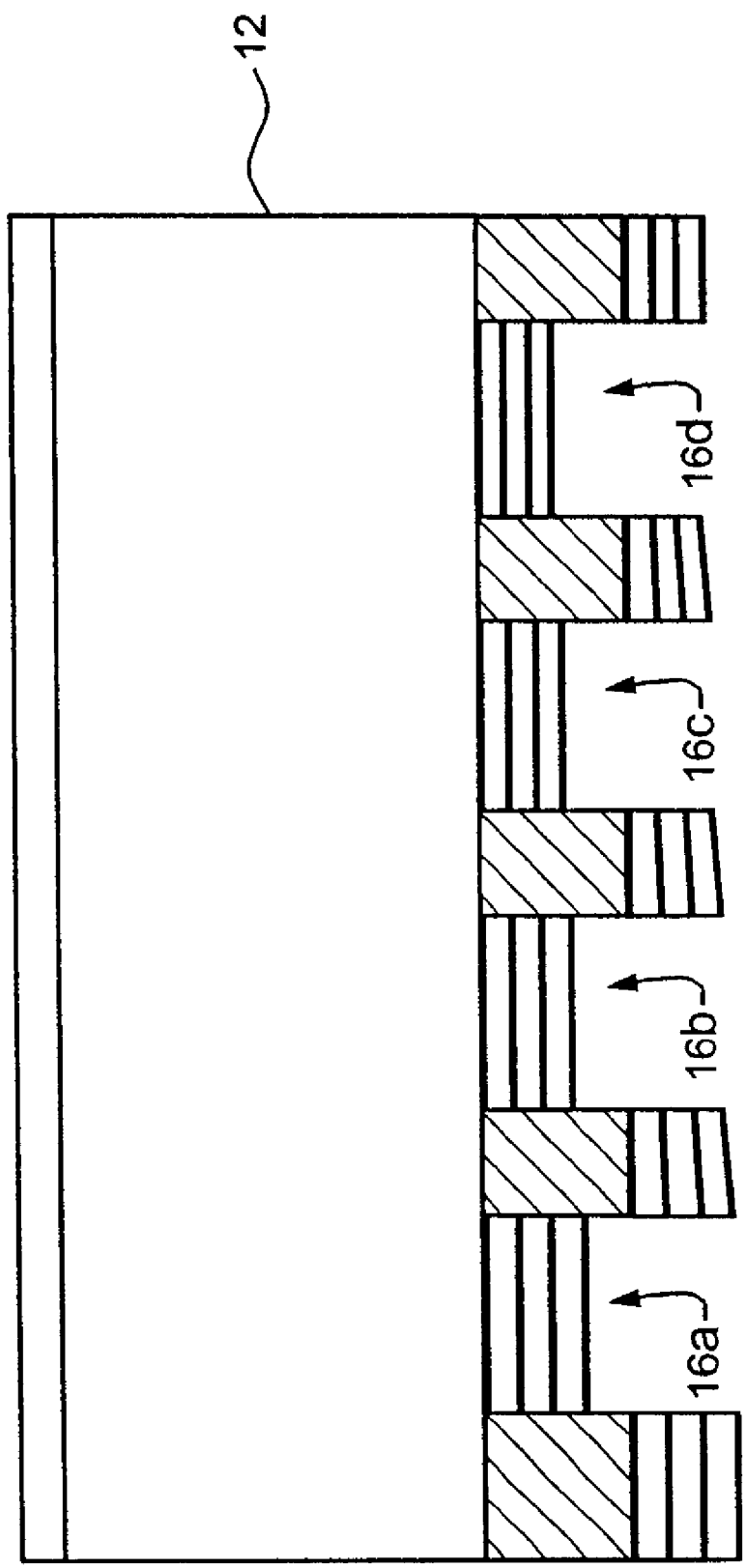
Figure 5D:
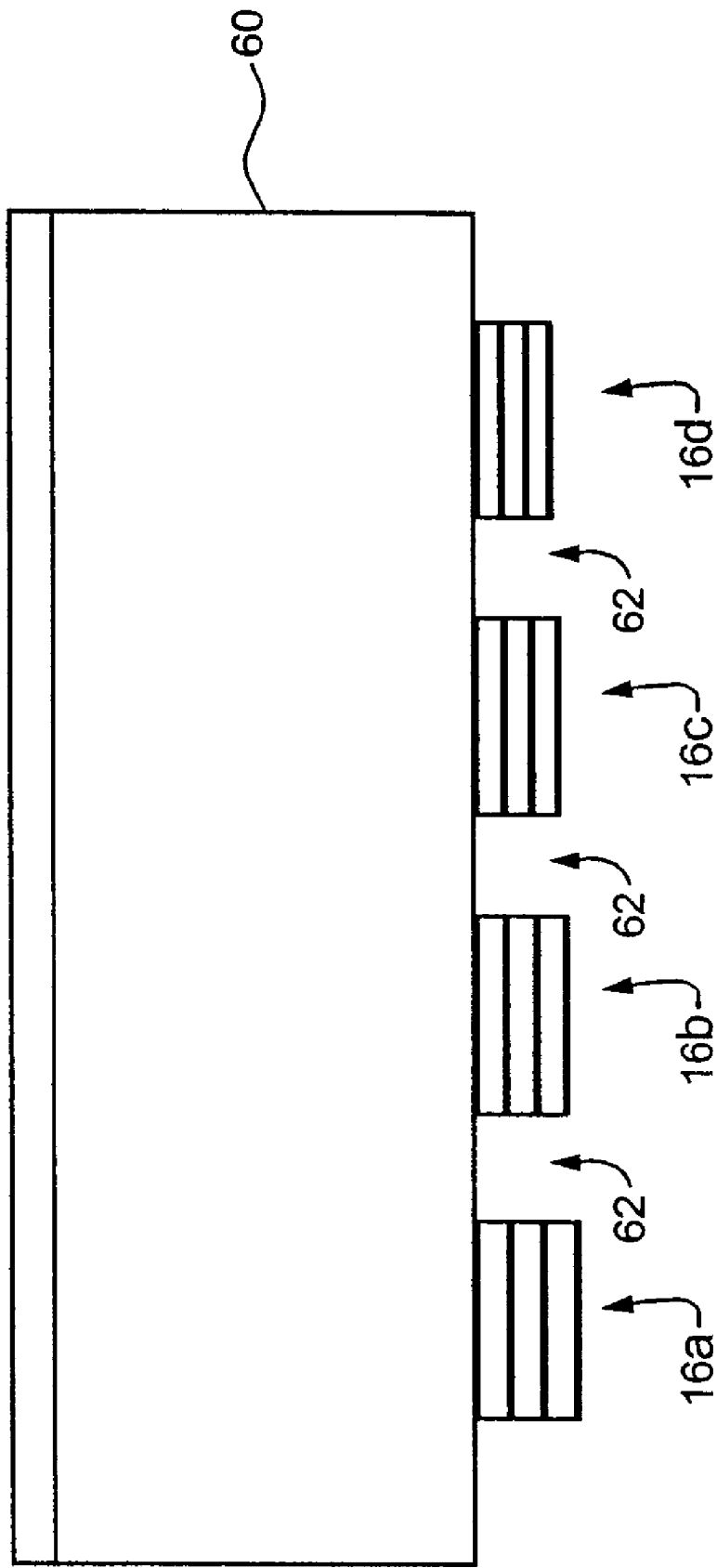
Figure 5E:
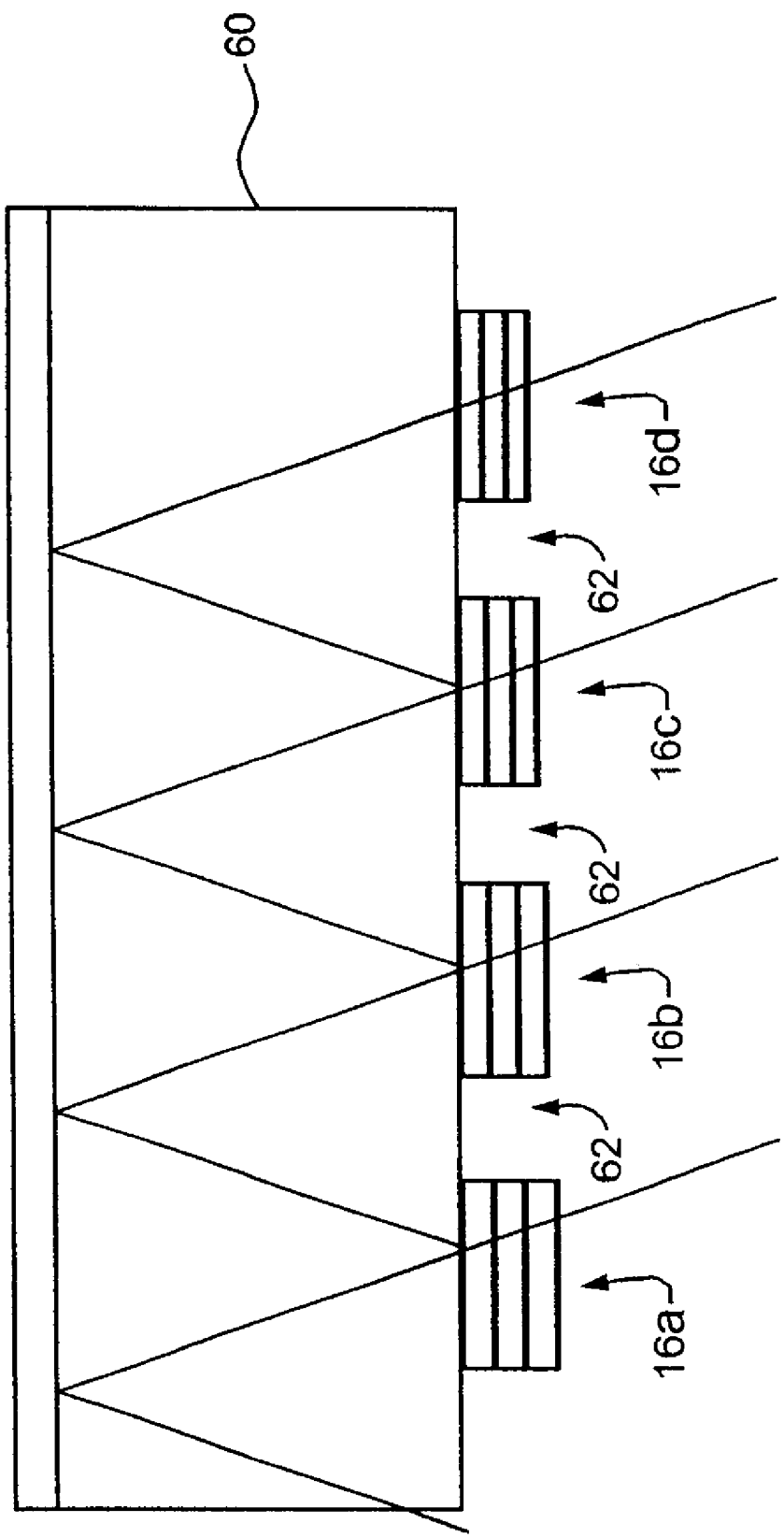
Figure 5F:
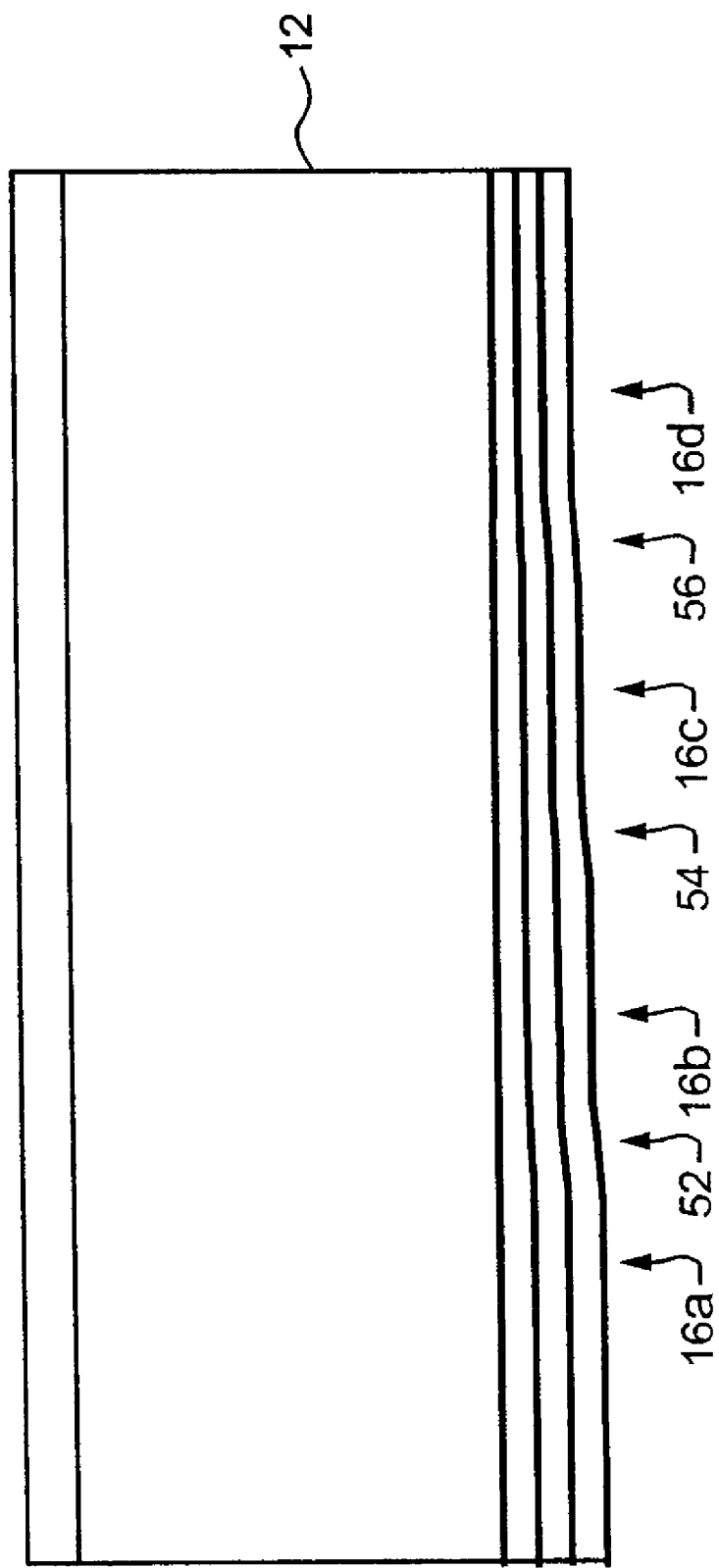
Figure 5H:
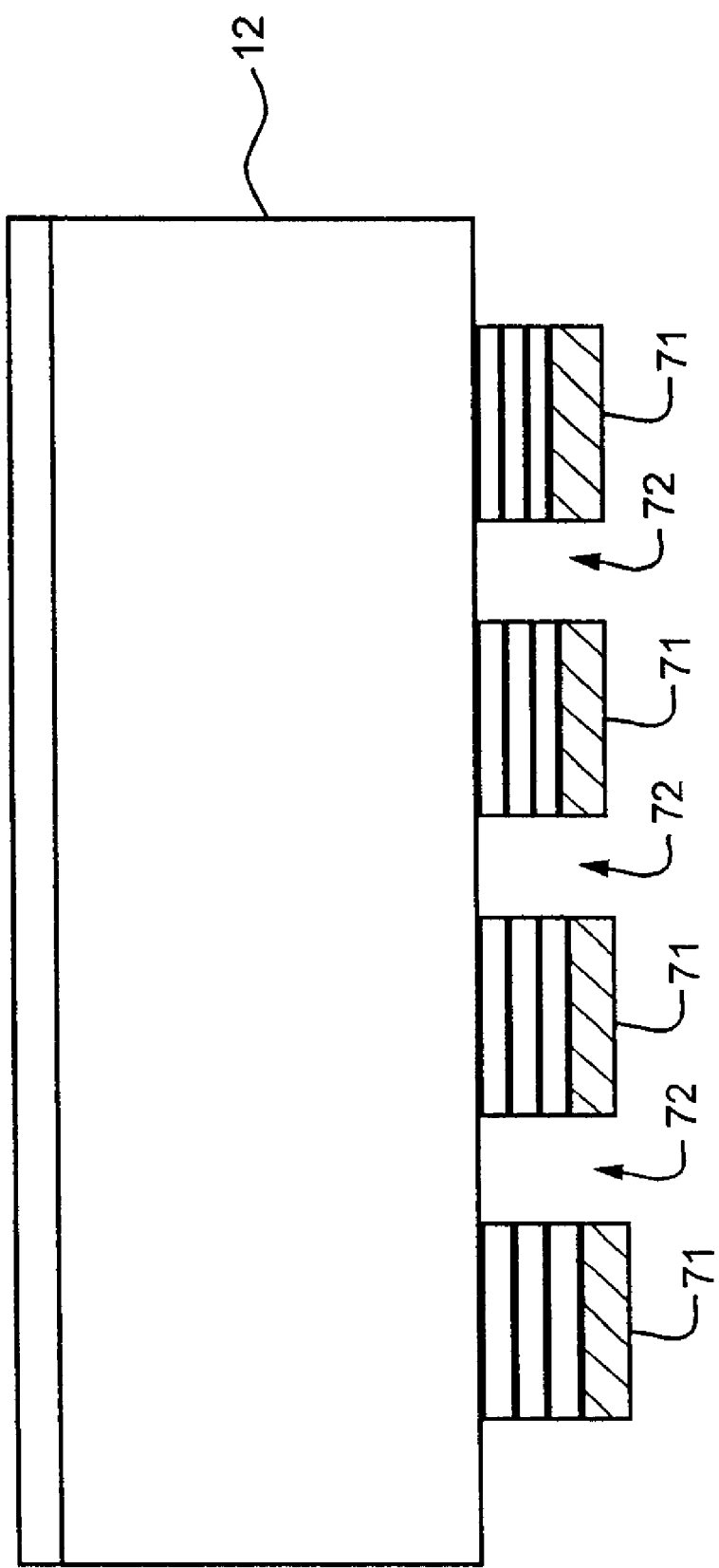
Figure 5I:
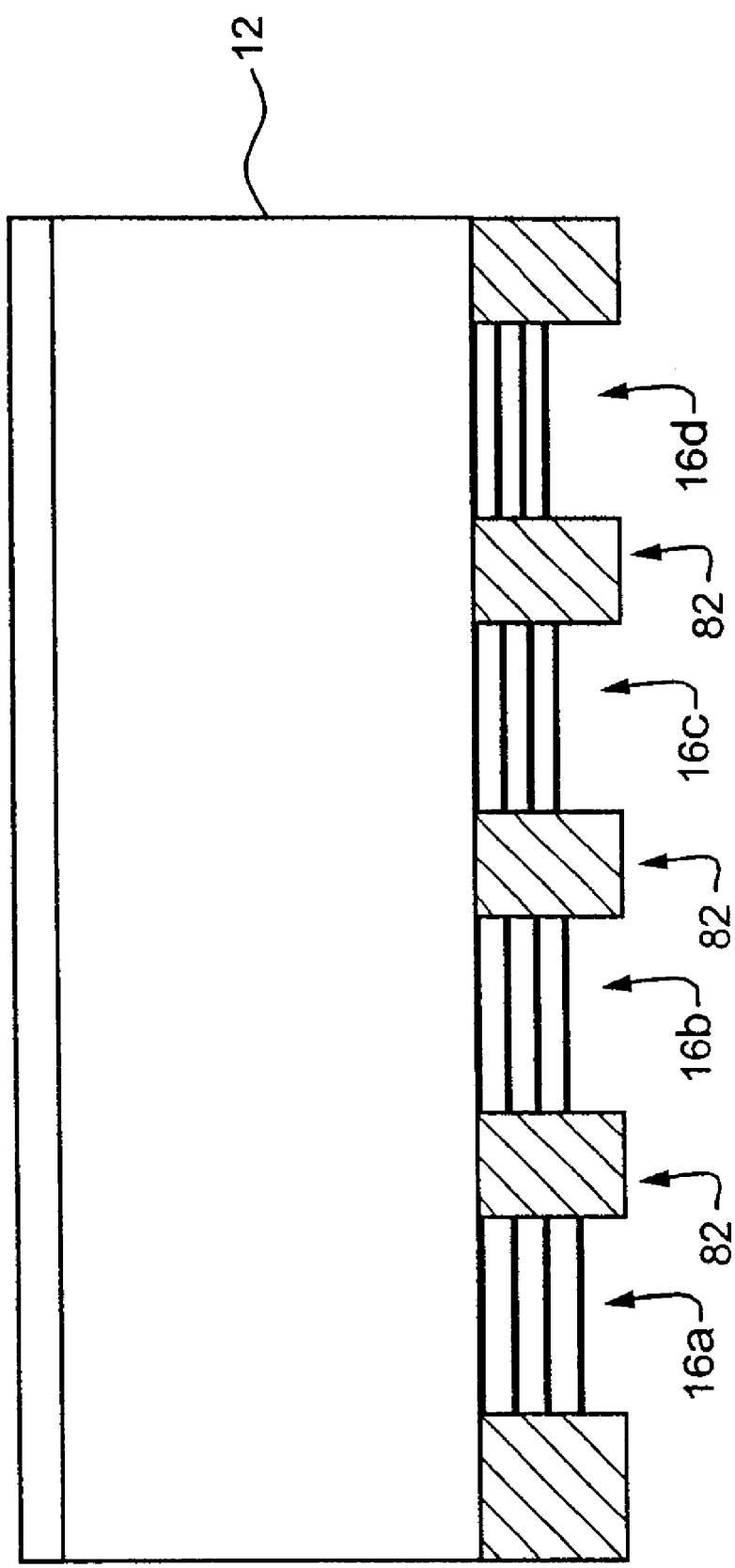
Figure 5J:
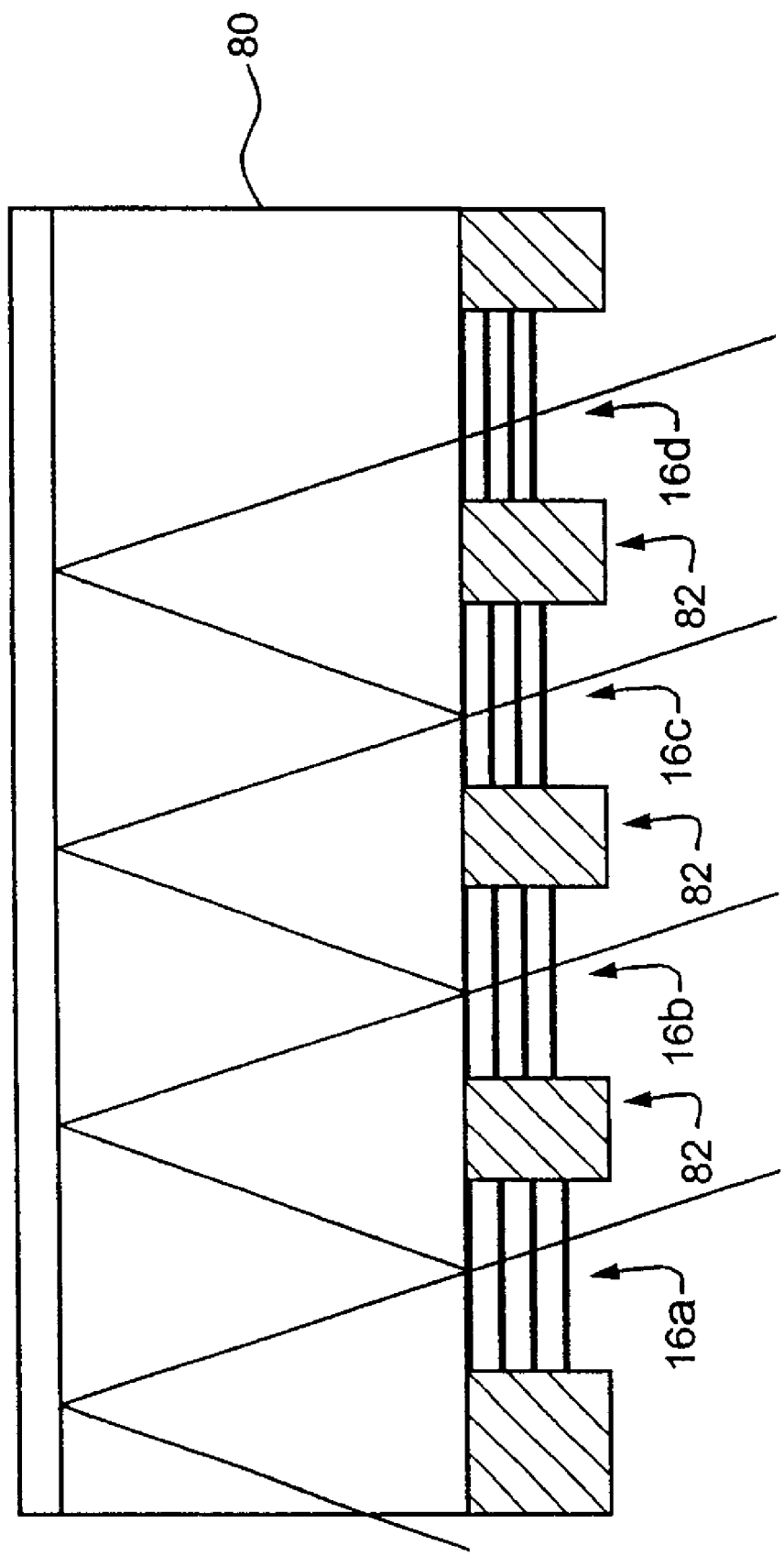

Referring now to FIGS. 5B–5E, there is shown a method for manufacturing optical filter 60 (FIG. 5E), in accordance with the present invention. In filter 60, an inter-channel transition structure 62 formed of air is positioned between each adjacent pair of optical structures. Referring now to FIG. 5B, there is shown a bare substrate 12 with a sacrificial mask material 61 applied thereon at all positions which are transition regions between adjacent pairs of optical structures. The sacrificial mask material 61 may be photoresist applied and patterned by methods standard in semiconductor fabrication art, a metal contact mask or other types of known masks. Next, the system of FIG. 1 is used to deposit thin film structures 16a, 16b, 16c, 16d upon substrate 12, with the result depicted in FIG. 5C. Subsequently the mask material 61, plus incidental thin film deposition on top of mask material 61, is removed by solvent dissolution of the polymer/resist mask, by lift-off of the metal contact mask or by other appropriate known method, to yield the structure of FIG. 5D. After the wafer is formed as in FIG. 2, the wafer is sliced into segments such as that shown in FIG. 3 in order to form each optical filter. As shown in FIG. 5E, in operation the filter structure shown in FIG. 5D constitutes a multi-channel optical filter/multiplexer/demultiplexer substantially similar in function to 34.

Referring now to FIGS. 5D and 5F–5H, there is shown a further method for manufacturing optical filter 60 (FIG. 5D), in accordance with the present invention. In filter 60, an inter-channel transition structure 62 formed of air is positioned between each adjacent pair of optical structures. Initially, the system of FIG. 1 is used to deposit "continuous" thin film structures 16a, 16b, 16c, 16d along with their respective gradual transition regions 52, 54, 56, upon substrate 12, with the result depicted in FIG. 5F. FIG. 5G depicts a sacrificial mask material 71 applied on top of the deposited thin films at all positions where optical structures 16a, 16b, 16c, 16d are located. The sacrificial mask material 71 may be photoresist applied and patterned by methods standard in semiconductor fabrication art, a metal contact mask or other types of known masks. Then the thin films in transition regions 52, 54, 56 are etched away by any of several known methods, including ion beam milling, reactive plasma etching, reactive ion etching, chemically-assisted ion beam etching, wet chemical etching and others, to yield the structure shown in FIG. 5H. Subsequently the mask 71, which may have itself been etched somewhat by the etching process, is removed by solvent dissolution of the polymer/resist mask, by lift-off of the metal contact mask or by other appropriate known method, to yield the structure of FIG. 5D.

Referring now to FIGS. 5B, 5C, 5I and 5J, there is shown a method for manufacturing optical filter 80 (FIG. 5J), in accordance with the present invention. In filter 80, an inter-channel transition structure formed of a permanent light blocking mask 82 is positioned between each adjacent pair of optical structures. The permanent mask material 82 may be a light-absorbing photoresist applied and patterned by methods standard in semiconductor fabrication art, a carbon-black-filled polymer mask applied through a silk screen then cured or may be other types of known light blocking masks. In the first step, a mask 82 is created with a structure equivalent to mask 61 of FIG. 5B. Next, the system of FIG. 1 is used to deposit thin film structures 16a, 16b, 16c, 16d upon substrate 12, with the result depicted in FIG. 5C. Subsequently the thin film on top of the permanent mask and preferably a portion of the top of the permanent mask is removed by a standard planar grinding or polishing method, for example chemical-mechanical polishing or random-movement lapping with abrasive slurry on a porous pad, to yield the structure shown in FIG. 5I. After the wafer is formed as in FIG. 2, the wafer is sliced into segments such as that shown in FIG. 3 in order to form each optical filter. In operation, the filter of structure shown in FIG. 5I constitutes a multi-channel optical filter/multiplexerdemultiplexer substantially similar in function to 34.

Figure 6:
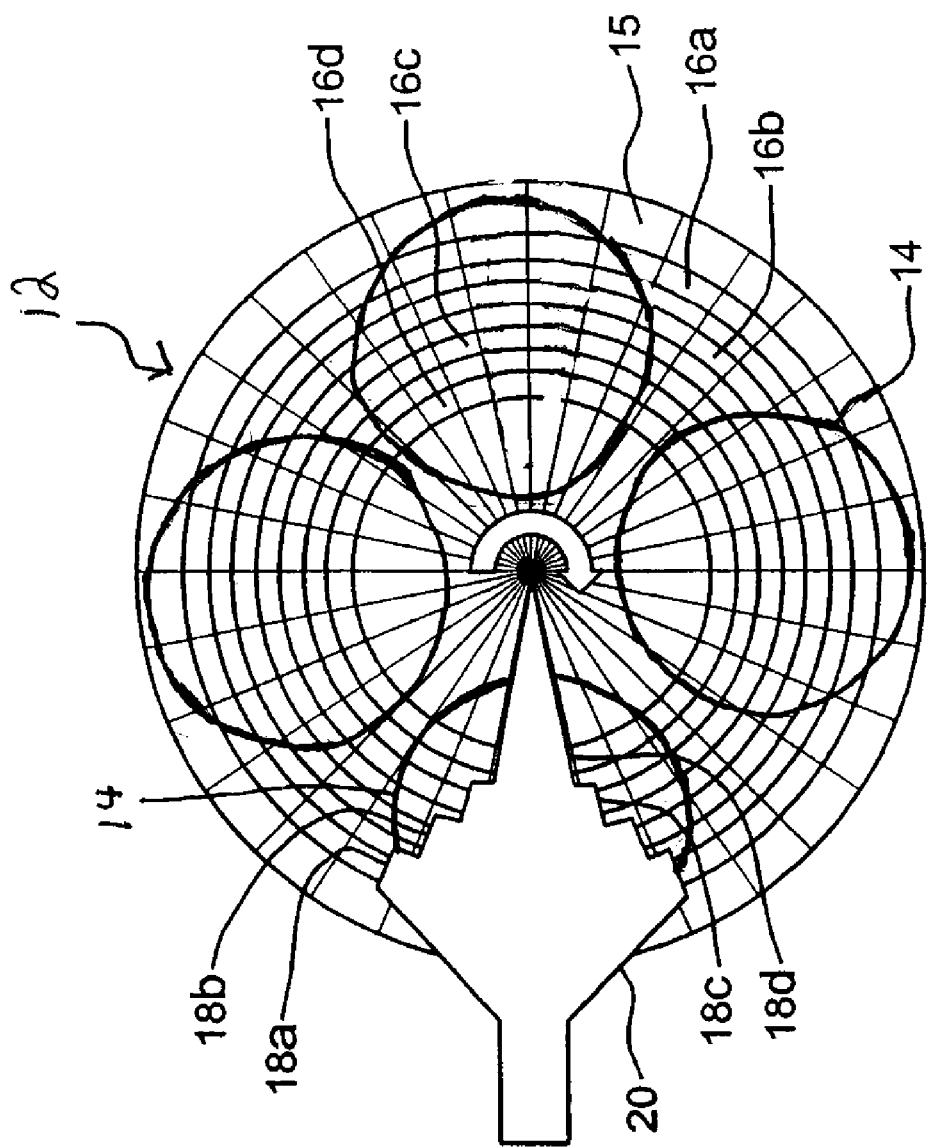
FIG. 6 is a diagram showing use of the stepped profile mask to create bands of deposited material having different thicknesses on a substrate that includes multiple wafers, in accordance with an alternative embodiment of the present invention.

In the embodiments shown in FIGS. 1–5, a wafer 14 that is centered on substrate 12 is shown. Also, in the embodiments of FIGS. 1–5, the wafer 14 and the substrate 12 may comprise the same object. In an alternate embodiment shown in FIG. 6, the system and method discussed above may be used to deposit multiple thin-film structures 16a, 16b, 16c, 16d on one or more wafers 14 each of which has a center that is offset from the axis of rotation of substrate 12. In the FIG. 6 embodiment, the substrate 12 comprises a platen, fixture or other wafer holder, with one or more openings that are sized to receive and hold wafers 14 during processing. Although the wafers 14 shown in FIG. 6 are round, any size and/or shape of wafer 14 could be utilized in the arrangement shown in FIG. 6. Wafers 14 formed using the substrate arrangement shown in FIG. 6 may be sliced in accordance with the methods discussed above to create an optical filter.

It will be appreciated by those skilled in the art that changes could be made to the embodiments described above without departing from the broad inventive concept thereof. It is understood, therefore, that this invention is not limited to the particular embodiments disclosed, but is intended to cover modifications within the spirit and scope of the present invention as defined in the appended claims.

What is claimed is:

1. A system for manufacturing thin-film structures disposed on a substrate, wherein the thin-film structures have different respective thicknesses that vary along a radius of the substrate, comprising:

(a) a rotating substrate;

(b) a source of deposited material directed at the rotating substrate; and (c) a mask positioned between the rotating substrate and the source, the mask having a stepped profile, each step of the stepped profile corresponding to one of the respective thicknesses; and wherein the radius is measured from an axis of rotation of the rotating substrate, and the substrate includes at least one wafer having a center that is offset from the axis of rotation.

2. The system of claim 1, further comprising at least one optical sensor that monitors at least one of the different respective thicknesses disposed along the radius by probing the at least one of the different respective thicknesses with light.

3. The system of claim 1, further comprising at least one optical sensor that monitors different respective thicknesses disposed along the radius by probing at least two of the different respective thicknesses with light.

4. The system of claim 3, further comprising:
(d) an actuator that varies a shadow of a second mask disposed over the rotating substrate;
(e) a process controller coupled to the at least one optical sensor and the actuator; and
(f) wherein the process controller varies the shadow of the second mask along a radius of the substrate to compensate for unwanted variations in deposition thickness over the substrate.

5. The system of claim 1, wherein the substrate includes two or more wafers each of which has a center that is offset from the axis of rotation.

6. A method for manufacturing thin-film structures disposed on a substrate, wherein the thin-film structures have different respective thicknesses that vary along a radius of the substrate, the method comprising the steps of:
(a) rotating the substrate;
(b) directing a source of deposited material at the rotating substrate; and
(c) positioning a mask having a stepped profile between the rotating substrate and the source, each step of the stepped profile corresponding to one of the respective thicknesses;
wherein the radius is measured from an axis of rotation of the substrate, and the substrate includes at least one wafer having a center that is offset from the axis of rotation.

7. The method of claim 6, wherein at least one optical sensor monitors at least one of the different respective thicknesses disposed along the radius by probing the at least one of the different respective thicknesses with light.

8. The method of claim 6, wherein at least one optical sensor monitors different respective thicknesses disposed along the radius by probing at least two of the different respective thicknesses with light.

9. The method of claim 8, further comprising:
(d) varying a shadow of a second mask disposed over the rotating substrate with an actuator;
(e) coupling a process controller to the at least one optical sensor and the actuator; and
(f) wherein the process controller varies the shadow of the second mask along a radius of the substrate to compensate for unwanted variations in deposition thickness over the substrate.

10. The method of claim 6, wherein the substrate includes two or more wafers each of which has a center that is offset from the axis of rotation.

11. The method of claim 6, further comprising the step of removing the wafer from the substrate and then dicing the wafer in order to form the thin-film structures.

12. A system for manufacturing thin-film structures disposed on a substrate, wherein the thin-film structures have different respective thicknesses that vary along a radius of the substrate, comprising:
(a) a rotating substrate;
(b) a source of deposited material directed at the rotating substrate; and
(c) a mask positioned between the rotating substrate and the source, the mask having a stepped profile, each step of the stepped profile corresponding to one of the respective thicknesses; and
wherein the radius is measured from an axis of rotation of the rotating substrate, and the substrate includes at least one wafer having a center that is coincident with the axis of rotation.

13. The system of claim 12, further comprising at least one optical sensor that monitors at least one of the different respective thicknesses disposed along the radius by probing the at least one of the different respective thicknesses with light.

14. The system of claim 12, further comprising at least one optical sensor that monitors different respective thicknesses disposed along the radius by probing at least two of the different respective thicknesses with light.

15. The system of claim 14, further comprising:
(d) an actuator that varies a shadow of a second mask disposed over the rotating substrate;
(e) a process controller coupled to the at least one optical sensor and the actuator; and
(f) wherein the process controller varies the shadow of the second mask along a radius of the substrate to compensate for unwanted variations in deposition thickness over the substrate.

16. A method for manufacturing thin-film structures disposed on a substrate, wherein the thin-film structures have different respective thicknesses that vary along a radius of the substrate, the method comprising the steps of:
(a) rotating the substrate;
(b) directing a source of deposited material at the rotating substrate; and
(c) positioning a mask having a stepped profile between the rotating substrate and the source, each step of the stepped profile corresponding to one of the respective thicknesses;
wherein the radius is measured from an axis of rotation of the substrate, and the substrate includes at least one wafer having a center that is coincident with the axis of rotation.

17. The method of claim 16, wherein at least one optical sensor monitors at least one of the different respective thicknesses disposed along the radius by probing the at least one of the different respective thicknesses with light.

18. The method of claim 16, wherein at least one optical sensor monitors different respective thicknesses disposed along the radius by probing at least two of the different respective thicknesses with light.

19. The method of claim 18, further comprising:
(d) varying a shadow of a second mask disposed over the rotating substrate with an actuator;
(e) coupling a process controller to the at least one optical sensor and the actuator; and
(f) wherein the process controller varies the shadow of the second mask along a radius of the substrate to compensate for unwanted variations in deposition thickness over the substrate.

* * * * *